United States Patent
Tolle et al.

(10) Patent No.: US 12,526,971 B2
(45) Date of Patent: Jan. 13, 2026

(54) REDUCED STRAIN SI/SIGE HETEROEPITAXY STACKS FOR 3D DRAM

(71) Applicant: Applied Materials, Inc., Santa Clara, CA (US)

(72) Inventors: John Byron Tolle, Gilbert, AZ (US); Tomohiko Kitajima, San Jose, CA (US); Thomas John Kirschenheiter, Tempe, AZ (US); Patricia M. Liu, Saratoga, CA (US); Zuoming Zhu, Santa Clara, CA (US); Joe Margetis, Gilbert, AZ (US); Fredrick David Fishburn, Aptos, CA (US); Abdul Wahab Mohammed, Santa Clara, CA (US); Gill Yong Lee, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 508 days.

(21) Appl. No.: 17/811,323

(22) Filed: Jul. 8, 2022

(65) Prior Publication Data

US 2023/0012819 A1    Jan. 19, 2023

Related U.S. Application Data

(60) Provisional application No. 63/221,797, filed on Jul. 14, 2021.

(51) Int. Cl.
H10B 12/00    (2023.01)

(52) U.S. Cl.
CPC ................................ H10B 12/01 (2023.02)

(58) Field of Classification Search
CPC ............. H01L 21/02532; H01L 21/311; H01L 21/31105; H10B 12/05
See application file for complete search history.

(56) References Cited

U.S. PATENT DOCUMENTS

| | | | |
|---|---|---|---|
| 2020/0043802 A1* | 2/2020 | Cheng | H01L 21/02236 |
| 2020/0266070 A1* | 8/2020 | Voronin | H01L 21/32136 |
| 2020/0274000 A1* | 8/2020 | Xie | H10D 64/017 |
| 2020/0350215 A1* | 11/2020 | Zhang | H10D 62/40 |
| 2021/0050415 A1* | 2/2021 | Bhuwalka | H10D 30/014 |
| 2021/0098573 A1* | 4/2021 | Chen | H10D 62/116 |
| 2021/0104617 A1* | 4/2021 | Hung | C30B 25/02 |
| 2021/0119005 A1* | 4/2021 | Colombeau | H01L 21/02532 |
| 2021/0210342 A1* | 7/2021 | Lee | H01L 21/02488 |
| 2021/0305277 A1* | 9/2021 | Peng | H10B 43/35 |
| 2022/0285362 A1* | 9/2022 | Fishburn | H10B 12/482 |
| 2022/0285364 A1* | 9/2022 | Fishburn | H10B 12/30 |

FOREIGN PATENT DOCUMENTS

CN    110277398 A * 9/2019 ........... H10D 64/661

OTHER PUBLICATIONS

International Search Report for PCT/US2022/036670, dated Nov. 9, 2022.

* cited by examiner

*Primary Examiner* — Edward Chin
(74) *Attorney, Agent, or Firm* — Moser Taboada

(57) ABSTRACT

Three-dimensional dynamic random-access memory (3D DRAM) structures and methods of formation of same are provided herein. In some embodiments, a 3D DRAM stack can include alternating silicon (Si) layers and silicon germanium (SiGe) layers. Each of the Si layers may have a height greater than a height of each of the SiGe layers. Methods and systems for formation of such structures are further provided.

17 Claims, 9 Drawing Sheets

REDUCED STRAIN SI/SIGE HETEROEPITAXY STACKS FOR 3D DRAM

CROSS-REFERENCE TO RELATED APPLICATIONS

This application claims benefit of U.S. provisional patent application Ser. No. 63/221,797, filed Jul. 14, 2021, which is herein incorporated by reference.

FIELD

Embodiments of the present principles generally relate to semiconductor manufacturing.

BACKGROUND

The storage and retrieval of data has been a limiting factor for many aspects of the computing industry. Memory devices can easily throttle the overall performance of modern computing devices. To make memory faster, memory structures have been scaled down to miniscule sizes, dramatically increasing the density of the memory structures. Three-dimensional memory structures, such as three-dimensional dynamic random-access memory (3D DRAM), may be used to further increase memory densities. In some three-dimensional memory structures, alternate layers of Si and SiGe are grown epitaxially from crystal silicon substrate. However, and as depicted in FIG. 1, in a typical 3D DRAM stack 100, a height of the Si layers 102 is substantially equal to a height of the SiGe layers 104. For some memory applications, the final gap width of the recessed region should be of a similar dimension or even larger than the final silicon channel width. However, the inventors have observed that there is a strain induced from the mismatch in lattice between Si and Ge. For thin layers the induced strain is not a problem. But for thick layers, the induced strain can be great enough to cause defects in the single crystal structure, known as "relaxation".

Accordingly, the inventors have provided Si/SiGe three-dimensional memory structures, and methods of making the same, that reduce or eliminate relaxation or wafer bow.

SUMMARY

Three-dimensional dynamic random-access memory (3D DRAM) structures, as well as methods and apparatus for forming such structures, are provided herein.

Herein, a "layer" means and refers to a single crystalline layer of material as well as multiple crystalline layers of the same material which in combination form a single crystalline layer.

In some embodiments, a 3D DRAM structure includes a stack of alternating silicon (Si) layers and silicon germanium (SiGe) layers; and wherein a height of each Si layer is greater than a height of each SiGe layer.

In some embodiments, a 3D DRAM structure includes a stack of alternating Si layers and SiGe layers; wherein a height of each Si layer is greater than a height of each SiGe layer; and wherein at least one Si layer has a height less than a height of at least one other Si layer.

In some embodiments, a 3D DRAM structure includes a stack of alternating Si layers and SiGe layers; wherein a height of each Si layer is greater than a height of each SiGe layer; wherein at least one SiGe layer includes at least one dopant; and wherein the at least one dopant is at least one of boron, carbon, nitrogen, oxygen, and phosphorous.

In some embodiments, a 3D DRAM structure includes a stack of alternating non-doped Si layers, doped Si layers and doped SiGe layers; wherein a respective doped Si layer is disposed immediately adjacent to and at opposing sides of a doped SiGe layer, wherein a height of each non-doped Si layer is greater than a height of each doped Si layer and is greater than a height of each doped SiGe layer; wherein the doped Si layers and the doped SiGe layers include at least one dopant; and wherein the at least one dopant is at least one of boron, carbon, nitrogen, oxygen, and phosphorous.

In some embodiments, a 3D DRAM structure includes a stack of alternating non-doped Si layers, doped Si layers and doped SiGe layers; wherein a respective doped SiGe layer is disposed immediately adjacent to and at opposing sides of a doped Si layer, wherein a height of each non-doped Si layer is greater than a height of each doped Si layer and is greater than a height of each doped SiGe layer; wherein the doped Si layers and the doped SiGe layers include at least one dopant; and wherein the at least one dopant is at least one of boron, carbon, nitrogen, oxygen, and phosphorous.

In some embodiments, a 3D DRAM structure includes a stack of alternating non-doped Si layers, doped Si layers and doped SiGe layers; and a doped isolation layer at a bottom of the stack of the alternating layers; wherein a respective doped SiGe layer is disposed immediately adjacent to and at opposing sides of a doped Si layer, wherein a height of each non-doped Si layer is greater than a height of each doped Si layer and is greater than a height of each doped SiGe layer; wherein the doped Si layers and the doped SiGe layers include at least one dopant; and wherein the at least one dopant is at least one of boron, carbon, nitrogen, oxygen, and phosphorous; and wherein the doped isolation layer includes at least one dopant that is different from the at least one dopant in the doped Si layers and doped SiGe layers.

In some embodiments, a 3D DRAM structure includes a stack of alternating Si layers and SiGe layers; wherein a height of each Si layer is greater than a height of each SiGe layer; wherein at least one SiGe layer includes at least one dopant; wherein the at least one SiGe layer has a central region having a dopant concentration higher than a dopant concentration in outer regions of the at least one SiGe layer; and wherein the at least one dopant is at least one of boron, carbon, nitrogen, oxygen, and phosphorous.

In some embodiments, a method of forming a three-dimensional dynamic random-access memory (3D DRAM) structure includes forming a stack of alternating silicon (Si) layers and silicon germanium (SiGe) layers wherein a height of the Si layers is more than a height of the SiGe layers; optionally adding a dopant to one or more of the Si layers; optionally adding a dopant to one or more of the SiGe layers; optionally creating a dopant gradient in the one or more SiGe layers; anisotropically etching a vertical slit or hole in the stack; isotropically etching a horizontal recess in at least one of the SiGe layers; and isotropically etching a horizontal recess in at least one of the Si layers.

In some embodiments, a method of forming a three-dimensional dynamic random-access memory (3D DRAM) structure includes: forming a stack of alternating silicon (Si) layers and silicon germanium (SiGe) layers, wherein a height of the Si layers is more than a height of the SiGe layers; anisotropically etching a vertical slit or hole in the stack; isotropically etching at least one of the SiGe layers to form a first horizontal recess, wherein the SiGe layer substantially completely removed between a portion of the Si layers; and isotropically etching a second horizontal recess in the portion of the Si layers adjacent to the at least one etched SiGe layer to form a thinned portion of the Si layer, wherein the first horizontal recess and the second horizontal recess together form a cavity between adjacent Si layers.

In some embodiments, a non-transitory computer readable medium, having instructions formed thereon is provided that, when executed, causes a process chamber to perform a method of forming a three-dimensional dynamic random-access memory (3D DRAM) structure in accordance with any of the embodiments disclosed herein.

In some embodiments, apparatus and systems are provided for forming a three-dimensional dynamic random-access memory (3D DRAM) structure in accordance with any of the embodiments disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
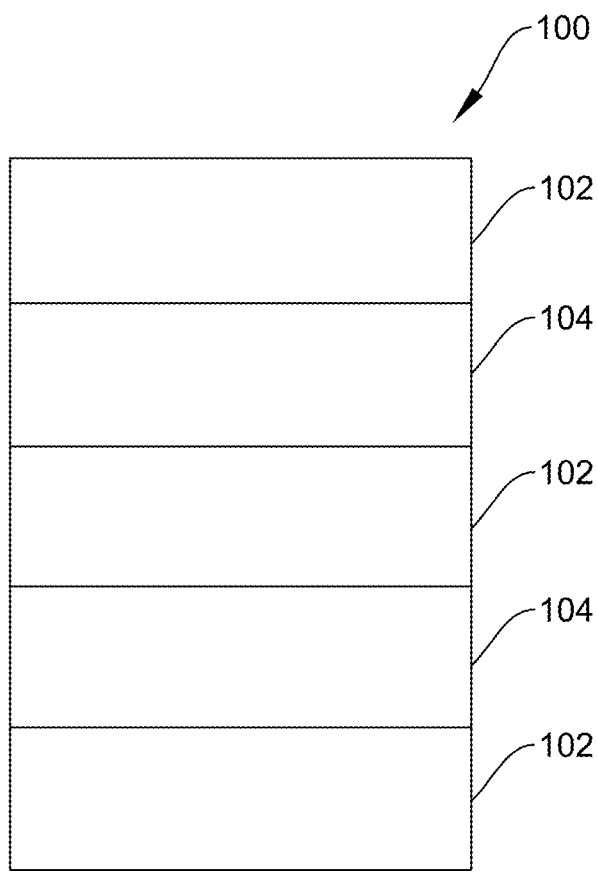
FIG. 1 depicts a schematic side view of a three-dimensional dynamic random-access memory (3D DRAM) structure in accordance with the prior art.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and structures provided herein enable production of three-dimensional (3D) dynamic random-access memory (DRAM) stacks. For example, the methods and structures provided herein enable production of 3D DRAM cells that include gate-all-around (GAA) structures around crystalline silicon (c-Si) channels. For example, embodiments of the present disclosure provide improved enabling structures suitable for further use in the fabrication of or as part of a process sequence for the fabrication of 3D DRAM cells that include gate-all-around (GAA) structures. The Si/SiGe three-dimensional memory structures provided herein advantageously reduce or eliminate the relaxation or wafer bow observed in some other three-dimensional memory structures.

Figure 2:
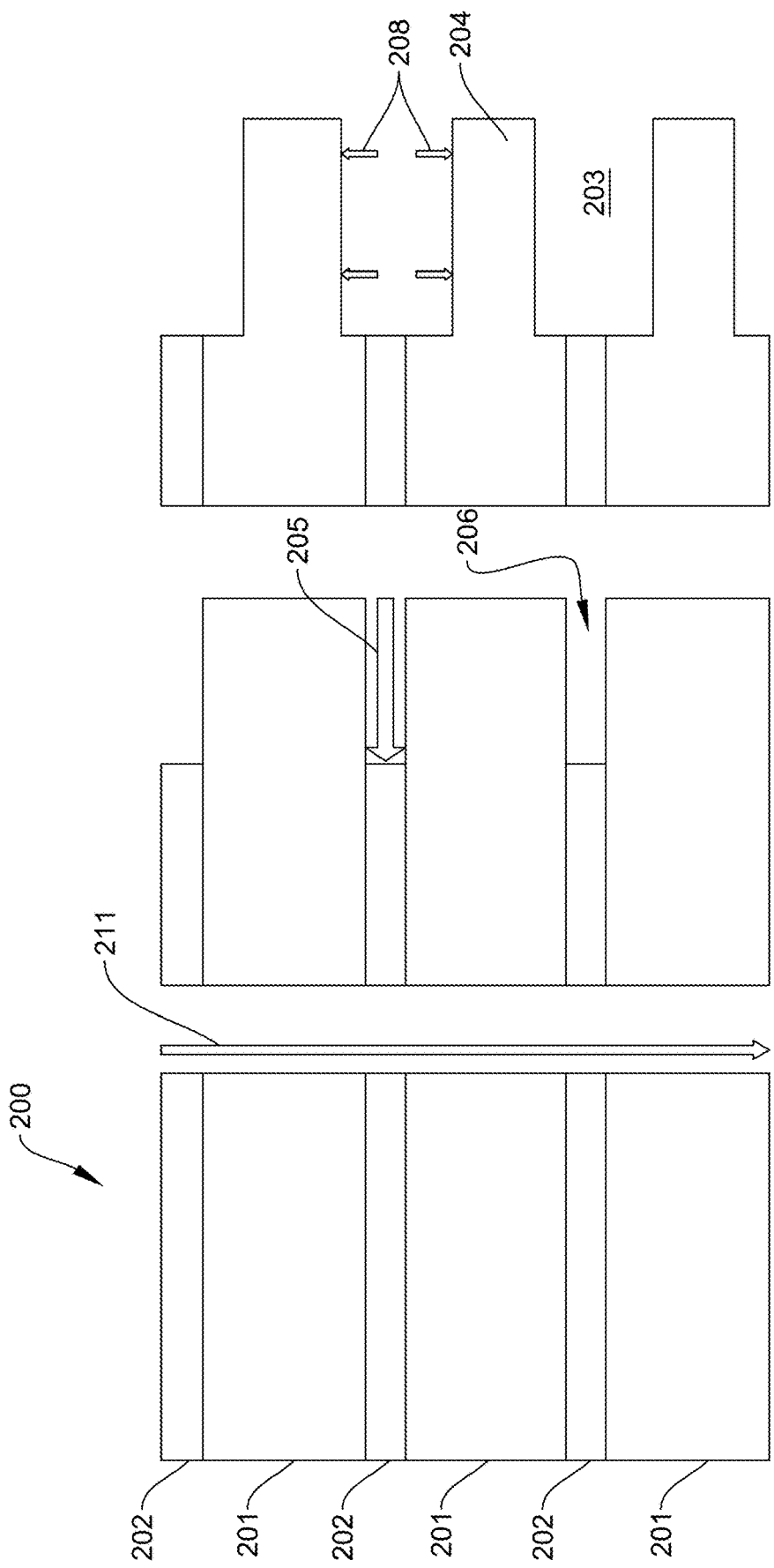
FIGS. 2A-2C depict a schematic side view of stages of fabrication of a three-dimensional dynamic random-access memory (3D DRAM) structure in accordance with at least some embodiments of the present disclosure.

FIGS. 2A-2C depict schematic side views of stages of fabrication of a 3D DRAM stack 200 in accordance with at least some embodiments of the present disclosure. The stack 200 includes alternating silicon (Si) layers 201 and silicon germanium (SiGe) layers 202. In one or more of the SiGe layers 202, Ge may be present at about 5 atomic percent to about 40 atomic percent, or about 10 atomic percent.

In embodiments, one Si layer 201 may vertically alternate with one SiGe layer 202. Although only three alternating pairs of the Si layers 201 and SiGe layers 202 are illustratively shown in FIGS. 2A-2C (and in each of the embodiments disclosed here), there may be different numbers of alternating layers in any of the disclosed embodiments. For example, in a typical 3D DRAM structure, there may be between 32 to about 128 repeating memory layers, or about 250 or more total layers.

In embodiments, each of the Si layers 201 may have a height (e.g., thickness) greater than a height (e.g., thickness) of each of the SiGe layers 202. In embodiments, one or more of the Si layers 201, including each of the Si layers 201, may be about 25 to about 50 nm in height. In embodiments, one or more of the SiGe layers 202, including all of the SiGe layers, may be about 3 to about 30 nm in height.

In embodiments and as shown in FIG. 2A, the stack 200 may undergo anisotropic etching to create a vertical slit or hole (indicated by arrow 211) through the alternating Si layers 201 and SiGe layers 202. The anisotropic etching can be done in any suitable manner to form the hole through each of the alternating Si layers 201 and SiGe layers 202. Although the hole is depicted along the edge of the figures, one of ordinary skill would appreciate that the hole is typically formed through the layers with material on all sides and that the illustrative features and processes described herein are typically performed to fabricate a plurality of such features (holes, recesses, etc.) simultaneously on a substrate, such as a semiconductor wafer or the like.

Thereafter, according to embodiments and as depicted in FIG. 2B, the stack 200 may undergo lateral isotropic etching of one or more of the SiGe layers 202 (as indicated by arrow 205) to form a recess 206 in the SiGe layers 202 in regions adjacent to the hole (e.g., arrow 211). The lateral isotropic etching of the SiGe layers 202 is selective to the SiGe layers 202 as compared to the Si layers 201 so that the recess 206 can be formed with little or no etching of the Si layers 201.

Next, according to embodiments and as depicted in FIG. 2C, the stack 200 may undergo isotropic etching of one or more of the Si layers 201 (as indicated by arrows 208). For example, the Si layers 201 may be isotropically etched to thin the Si layers 201 to form thinned portions 204 of the Si layers 201 adjacent to the recess 206 formed in the SiGe layers 202. Such thinned portions 204 of the Si layers 201 can correspond to Si channel regions in a fully fabricated 3D DRAM device. In embodiments, the one or more thinned portions 204 may be about 10 to about 40 nm in height (e.g., thickness).

Accordingly, one or more cavities, or openings 203, can be formed (e.g., as defined by the recessed SiGe layer 202 and adjacent thinned portions 204 of the Si layer 201). Thus, the openings 203 have a height equal to about the height of the SiGe layer 202 and the heights of the etched portions of Si layers 201 on opposing sides of the opening 203. In embodiments, one or more of the openings 203 may be about 10 to about 40 nm in height (e.g., thickness).

Figure 3:
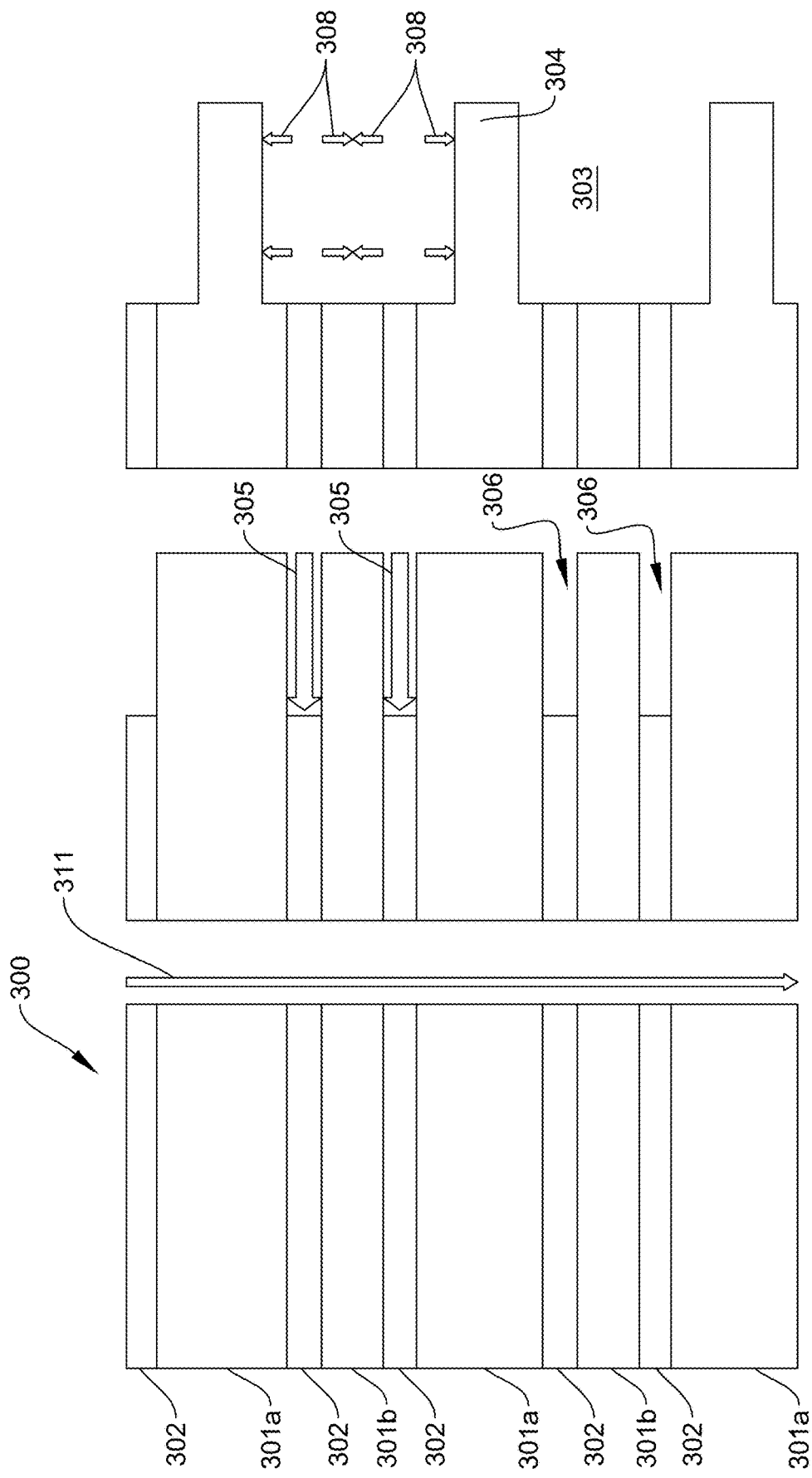
FIGS. 3A-3C depict a schematic side view of stages of fabrication of a three-dimensional dynamic random-access memory (3D DRAM) structure in accordance with at least some embodiments of the present disclosure.

FIGS. 3A-3C depict schematic side views of stages of fabrication of a 3D DRAM structure in accordance with at least some embodiments of the present disclosure. Similar layers and features can be as described above with respect to FIGS. 2A-2C. The structure can include a stack 300 of alternating Si layers 301a, b and SiGe layers 302. In one or more of the SiGe layers 302, Ge may be present at about 5 atomic percent to about 40 atomic percent, or about 10 atomic percent.

In embodiments, the stack 300 can include a vertically repeating sequence of layers which may include one Si layer 301a, and immediately adjacent thereto, one SiGe layer 302, and immediately adjacent thereto, one other Si layer 301b, and immediately adjacent thereto, one other SiGe layer 302.

In embodiments, each of the Si layers 301a, b may have a height greater than a height of each of the SiGe layers 302. In embodiments, one or more Si layers 301b can have a height less than a height of one or more Si layers 301a. One or more of the Si layers 301a may be about 40 nm in height. One or more of the Si layers 301b may be about 20 nm in height. One or more of the SiGe layers 302 may be about 3 to about 20 nm in height.

In embodiments and as shown in FIG. 3A, the stack 300 may undergo anisotropic etching to create a vertical slit or hole (indicated by arrow 311) through the alternating Si layers 301a,b and SiGe layers 302. The anisotropic etching can be done in any suitable manner to form the hole through each of the alternating Si layers 301a,b and SiGe layers 302. Although the hole is depicted along the edge of the figures, one of ordinary skill would appreciate that the hole is typically formed through the layers with material on all sides and that the illustrative features and processes described herein are typically performed to fabricate a plurality of such features (holes, recesses, etc.) simultaneously on a substrate, such as a semiconductor wafer or the like.

Thereafter, according to embodiments and as depicted in FIG. 3B, the stack 300 may undergo lateral isotropic etching of one or more of the SiGe layers 302 (as indicated by arrows 305) to form a recess 306 in the SiGe layers 302 in regions adjacent to the hole (e.g., arrow 311). The lateral isotropic etching of the SiGe layers 302 is selective to the SiGe layers 302 as compared to the Si layers 301a,b so that the recess 306 can be formed with little or no etching of the Si layers 301a,b.

Next, according to embodiments and as depicted in FIG. 3C, the stack 300 may undergo isotropic etching of one or more of the Si layers 301a and/or one or more of the Si layers 301b (as indicated by arrows 308). For example, the Si layers 301a,b may be isotropically etched to thin the Si layers 301a,b to form thinned portions 304 of the Si layers 301a adjacent to the recess 306 formed in the SiGe layers 302. Moreover, the portion of the Si layer 301b adjacent the recess 306 can be completely removed (e.g., due to the reduced thickness of the Si layer 301b as compared to the Si layer 301a). Such thinned portions 304 of the Si layers 301a can correspond to Si channel regions in a fully fabricated 3D DRAM device. In embodiments, the one or more thinned portions 304 may be about 10 to about 40 nm in height.

Accordingly, one or more cavities, or openings 303, can be formed (e.g., as defined by the recessed SiGe layers 302, removed portion of Si layer 301b, and adjacent thinned portions 304 of the Si layer 301a). Thus, the openings 303 have a height equal to about the height of the two SiGe layers 302 on either side of the Si layer 301b, the height of the Si layer 301b, and the heights of the etched portions of Si layers 301a on opposing sides of the opening 303. In embodiments, one or more of the openings 303 may be about 30 to about 90 nm in height.

Figure 4:
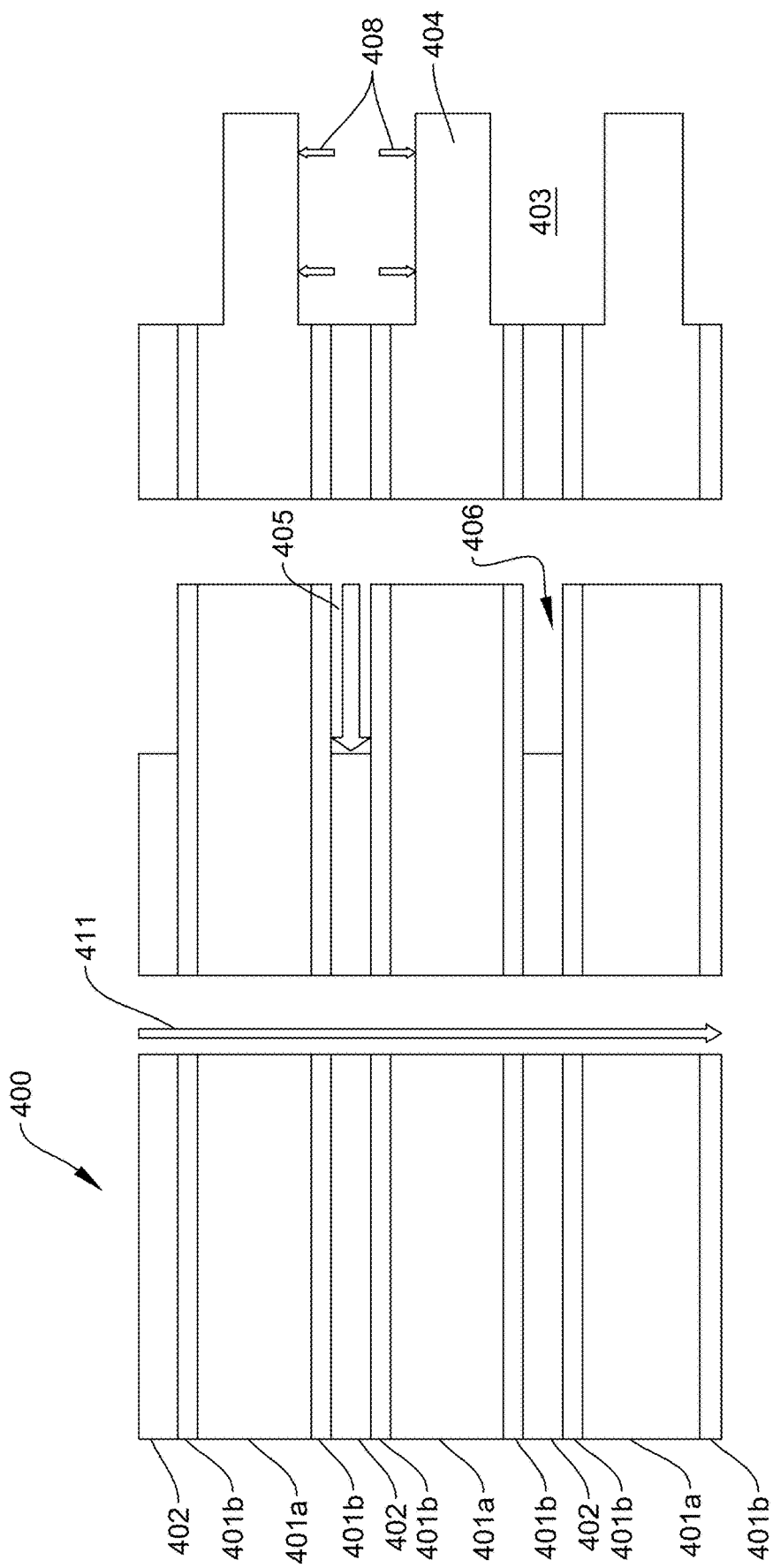
FIGS. 4A-4C depict a schematic side view of stages of fabrication of a three-dimensional dynamic random-access memory (3D DRAM) structure in accordance with at least some embodiments of the present disclosure.

FIGS. 4A-4C depict schematic side views of a 3D DRAM stack 400 in accordance with at least some embodiments of the present disclosure. Similar layers and features can be as described above with respect to FIGS. 2A-2C and 3A-3C. The stack 400 includes alternating non-doped Si layers 401a, doped Si layers 401b, and doped SiGe layers 402. In embodiments, a respective doped Si layer 401b can be disposed immediately adjacent to and at opposing sides of a doped SiGe layer 402. In one or more of the SiGe layers 402, Ge may be present at about 5 atomic percent to about 40 atomic percent, or about 10 atomic percent.

In embodiments, the stack 400 may include a vertically repeating sequence of layers which may include one non-doped Si layer 401a, and immediately adjacent thereto, one doped Si layer 401b, and immediately adjacent thereto, one doped SiGe layer 402, and immediately adjacent thereto, one other doped Si layer 401b.

In embodiments, a height of each non-doped Si layer 401a can be greater than a height of each doped Si layer 401b and can also be greater than a height of each doped SiGe layer 402. One or more of the non-doped Si layers 401a may be about 25 to about 60 nm in height, such as about 40 nm in height. One or more of the doped Si layers 401b may be of a height sufficiently thin such that the doped Si layer 401b can be removed in subsequent processing as discussed below, such as about 5 to about 35 nm in height, or about 5 nm in height. One or more of the doped SiGe layers 402 may be about 3 to about 15 nm in height.

In embodiments, one or more of the doped Si layers 401b and one or more of the doped SiGe layers 402 can include one or more dopants. In embodiments, the dopant(s) may be one or more of boron, carbon, nitrogen, oxygen, or phosphorous. The dopant in the one or more of the doped Si layers 401b and one or more of the doped SiGe layers 402 can be the same dopant or a different dopant. In some embodiments, the dopant is the same in the one or more of the doped Si layers 401b and the one or more of the doped SiGe layers 402. In some embodiments, the dopant is carbon. In embodiments where the dopant is carbon, the dopant(s) in one or more of the doped Si layers 401b and/or in one or more of the doped SiGe layers 402 can be at a concentration of from about 0.3 to about 1.5 atomic percent, such as about 1 atomic percent. In embodiments where the dopant is boron or phosphorous, the dopant(s) in one or more of the doped Si layers 401b and/or in one or more of the doped SiGe layers 402 can be at a concentration of up to about 0.01 atomic percent. In embodiments where the dopant is nitrogen or oxygen, the dopant(s) in one or more of the doped Si layers 401b and/or in one or more of the doped SiGe layers 402 can be at a concentration of up to about 100 ppm.

In embodiments and as depicted in FIG. 4A, the stack 400 may undergo anisotropic etching to create a vertical slit or hole (indicated by arrow 411) through the alternating Si layers 401a,b and SiGe layers 402. The anisotropic etching can be done in any suitable manner to form the hole through each of the alternating Si layers 401a,b and SiGe layers 402.

Although the hole is depicted along the edge of the figures, one of ordinary skill would appreciate that the hole is typically formed through the layers with material on all sides and that the illustrative features and processes described herein are typically performed to fabricate a plurality of such features (holes, recesses, etc.) simultaneously on a substrate, such as a semiconductor wafer or the like.

Thereafter, according to embodiments and as depicted in FIG. 4B, the stack 400 may undergo lateral isotropic etching of one or more of the doped SiGe layers 402 (as indicated by arrows 405) to form a recess 406 in the doped SiGe layers 402 in regions adjacent to the hole (e.g., arrow 411). The lateral isotropic etching of the SiGe layers 402 is selective to the SiGe layers 402 as compared to the Si layers 401a,b so that the recess 406 can be formed with little or no etching of the Si layers 401a, b.

Next, according to embodiments and as depicted in FIG. 4C, the stack 400 may undergo isotropic etching of one or more of the non-doped Si layers 401a and one or more of the doped Si layers 401b (as indicated by arrows 408). For example, the doped Si layers 401b may be isotropically etched to remove the portion of the doped Si layers 401b adjacent to the recess 406 and the non-doped Si layer 401a can be isotropically etched to thin the non-doped Si layers 401a to form thinned portions 404 of the non-doped Si layers 401a adjacent to the recess 406. Such thinned portions 404 of the non-doped Si layers 401a can correspond to Si channel regions in a fully fabricated 3D DRAM device. In embodiments, the one or more thinned portions 404 may be about 10 to about 40 nm in height.

Accordingly, one or more cavities, or openings 403, can be formed (e.g., as defined by the doped SiGe layer 402, the doped Si layers 401b on opposing sides of the doped SiGe layer 402, and adjacent thinned portions 404 of the non-doped Si layers 401a on either side of the doped Si layers 401b). Thus, the openings 403 have a height equal to about the height of the doped SiGe layer 402, plus the height of the doped Si layers 401b on opposing sides of the doped SiGe layer 402, and plus the heights of the etched portions of the non-doped Si layers 401a on either side of the doped Si layers 401b. In embodiments, one or more of the openings 403 may be about 30 to about 90 nm in height.

Figure 5:
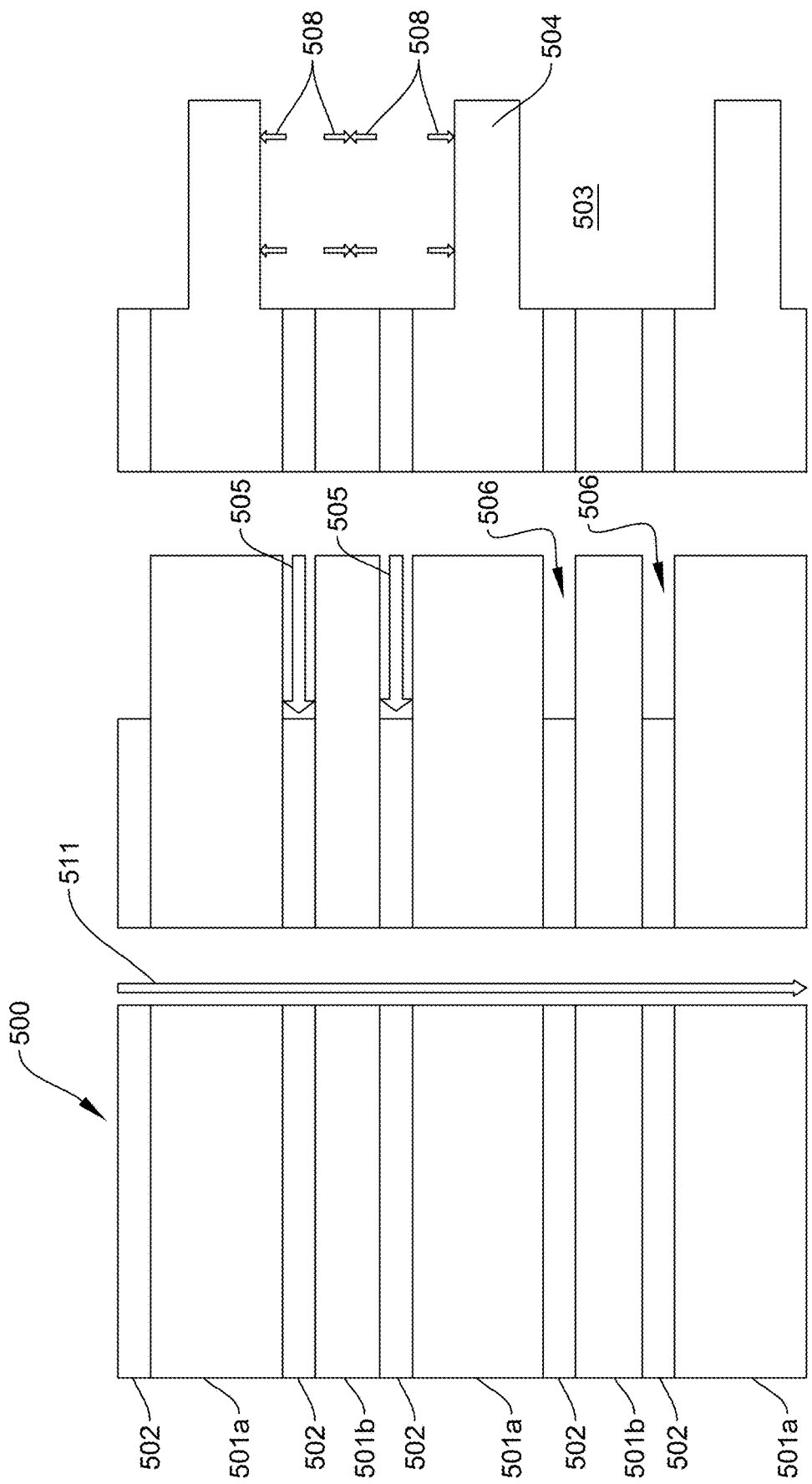
FIGS. 5A-5C depict a schematic side view of stages of fabrication of a three-dimensional dynamic random-access memory (3D DRAM) structure in accordance with at least some embodiments of the present disclosure.

FIGS. 5A-5C depict schematic side views of a 3D DRAM stack 500 in accordance with at least some embodiments of the present disclosure. Similar layers and features can be as described above with respect to FIGS. 2A-2C, 3A-3C, and 4A-4C. The stack 500 can include alternating non-doped Si layers 501a, doped Si layers 501b, and doped SiGe layers 502. In embodiments, a respective doped SiGe layer 502 can be disposed immediately adjacent to and at opposing sides of a doped Si layer 501b. In one or more of the SiGe layers 502, Ge may be present at about 5 atomic percent to about 40 atomic percent, or about 10 atomic percent.

In embodiments, the stack 500 may include a vertically repeating sequence of layers which may include one non-doped Si layer 501a, and immediately adjacent thereto, one doped SiGe layer 502, and immediately adjacent thereto, one doped Si layer 501b, and immediately adjacent thereto, one other doped SiGe layer 502.

In embodiments, a height of each non-doped Si layer 501a can be greater than a height of each doped Si layer 501b and can also be greater than a height of each doped SiGe layer 502. In embodiments, one or more of the non-doped Si layers 501a may be about 25 to about 60 nm in height, such as about 40 nm in height. In embodiments, one or more of the doped Si layers 501b may be of a height sufficiently thin such that the doped Si layer 501b can be removed in subsequent processing as discussed below, such as about 5 to about 35 nm in height, or about 20 nm in height. In embodiments, one or more of the doped SiGe layers 502 may be about 3 nm to about 15 nm in height, or about 10 nm in height.

In embodiments, one or more of the doped Si layers 501b and one or more of the doped SiGe layers 502 can include one or more dopants. In embodiments, the dopants may be one or more of boron, carbon, nitrogen, oxygen, or phosphorous. The dopant in the doped Si layers and doped SiGe layers can be the same dopant or a different dopant. In some embodiments, the dopant is the same in the one or more of the doped Si layers and the one or more of the doped SiGe layers. In some embodiments, the dopant is carbon. In embodiments, the dopant(s) in one or more of the doped Si layers 501b and/or in one or more of the doped SiGe layers 502 can be at a concentrations as described above with respect to FIG. 4.

In embodiments and as depicted in FIG. 5A, the stack 500 may undergo anisotropic etching to create a vertical slit or hole (indicated by arrow 511) through the alternating non-doped Si layers 501a, doped Si layers 501b, and doped SiGe layers 502. The anisotropic etching can be done in any suitable manner to form the hole through each of the alternating non-doped Si layers 501a, doped Si layers 501b, and doped SiGe layers 502. Although the hole is depicted along the edge of the figures, one of ordinary skill would appreciate that the hole is typically formed through the layers with material on all sides and that the illustrative features and processes described herein are typically performed to fabricate a plurality of such features (holes, recesses, etc.) simultaneously on a substrate, such as a semiconductor wafer or the like.

Thereafter, according to embodiments and as depicted in FIG. 5B, the stack 500 may undergo lateral isotropic etching of one or more of the doped SiGe layers 502 (as indicated by arrows 505) to form recesses 506 in the doped SiGe layers 502 in regions adjacent to the hole (e.g., arrow 511). The lateral isotropic etching of the doped SiGe layers 502 is selective to the doped SiGe layers 502 as compared to the Si layers 501a,b so that the recess 506 can be formed with little or no etching of the Si layers 501a,b.

Next, according to embodiments and as depicted in FIG. 5C, the stack 500 may undergo isotropic etching of one or more of the non-doped Si layers 501a and/or one or more of the doped Si layers 501b (as indicated by arrows 508). For example, the doped Si layers 501b may be isotropically etched to remove the portion of the doped Si layers 501b adjacent to the recesses 506 and the non-doped Si layer 501a can be isotropically etched to thin the non-doped Si layers 501a to form thinned portions 504 of the non-doped Si layers 501a adjacent to the recesses 506. Such thinned portions 504 of the non-doped Si layers 501a can correspond to Si channel regions in a fully fabricated 3D DRAM device. In embodiments, the one or more thinned portions 504 may be about 10 to about 40 nm in height.

Accordingly, one or more cavities, or openings 503, can be formed (e.g., as defined by the doped SiGe layers 502, the doped Si layer 501b between the doped SiGe layers 502, and adjacent thinned portions 504 of the non-doped Si layers 501a on either side of the doped SiGe layers 502). Thus, the openings 503 have a height equal to about the height of the doped Si layer 501b, plus the height of the doped SiGe layers 502 on opposing sides of the doped Si layer 501b, and plus the heights of the etched portions of the non-doped Si layers

501a on either side of the opening 503. In embodiments, one or more of the openings 503 may be about 30 to about 90 nm in height.

Figure 6:
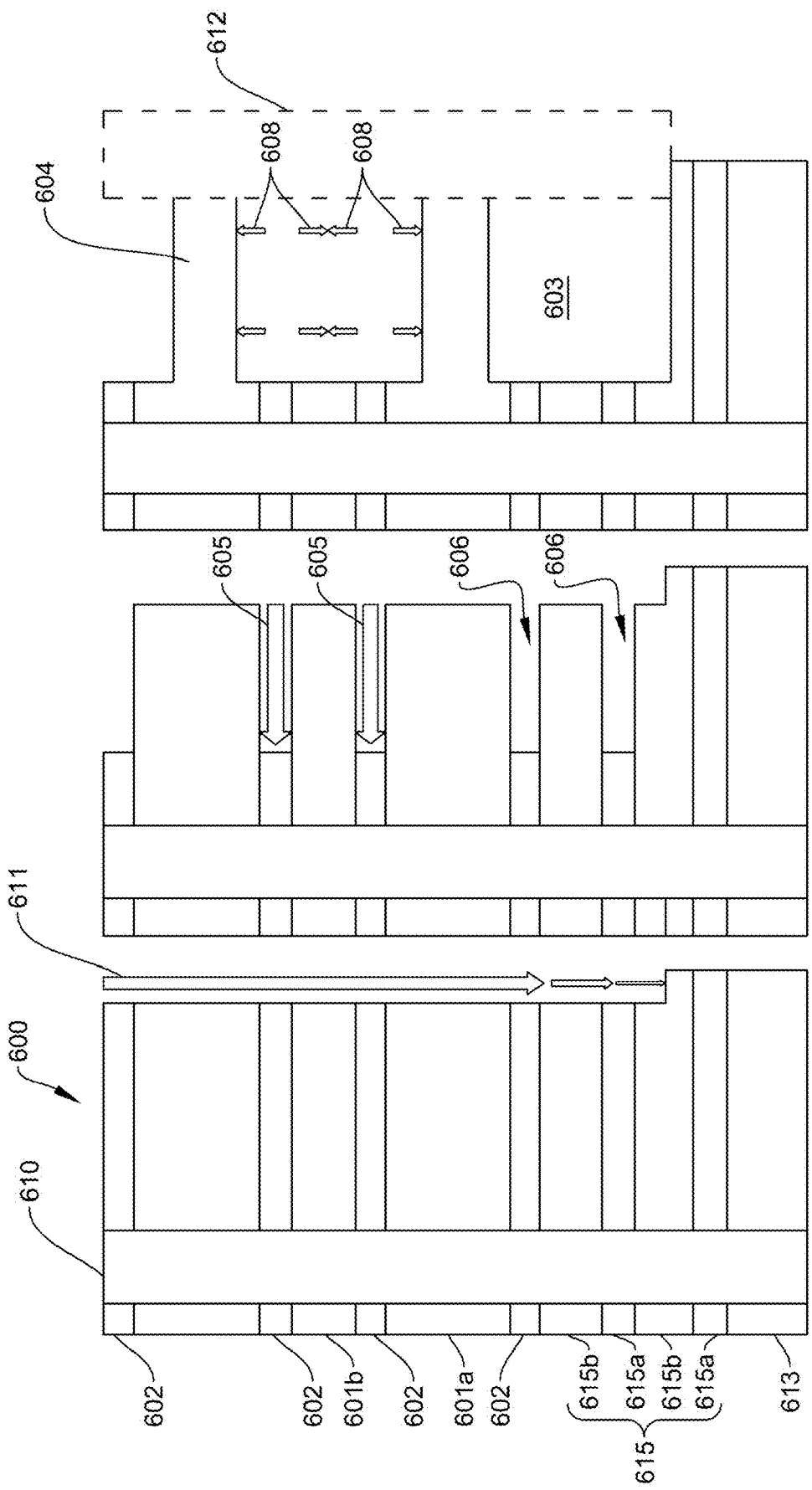
FIGS. 6A-6C depict a schematic side view of stages of fabrication of a three-dimensional dynamic random-access memory (3D DRAM) structure in accordance with at least some embodiments of the present disclosure.

FIGS. 6A-6C depict schematic side views of a 3D DRAM stack 600 in accordance with at least some embodiments of the present disclosure. Similar layers and features can be as described above with respect to FIGS. 2A-2C, 3A-3C, 4A-4C, and 5A-5C. The stack 600 can include alternating non-doped Si layers 601a, doped Si layers 601b, and doped SiGe layers 602. In embodiments, a respective doped SiGe layer 602 can be disposed immediately adjacent to and at opposing sides of a doped Si layer 601b. In one or more of the SiGe layers 602, Ge may be present at about 5 atomic percent to about 40 atomic percent, or about 10 atomic percent.

In embodiments, the stack 600 may include a vertically repeating sequence of layers which may include one non-doped Si layer 601a, and immediately adjacent thereto, one doped SiGe layer 602, and immediately adjacent thereto, one doped Si layer 601b, and immediately adjacent thereto, one other doped SiGe layer 602.

In embodiments, a height of each non-doped Si layer 601a can be greater than a height of each doped Si layer 601b and can also be greater than a height of each doped SiGe layer 602. In embodiments, one or more of the non-doped Si layers 601a may be about 25 to about 60 nm, such as about 40 nm, in height. In embodiments, one or more of the doped Si layers 601b may be about 5 to about 35 nm, such as about 20 nm, in height. In embodiments, one or more of the doped SiGe layers 602 may be about 3 nm to about 15 nm in height, such as about 10 nm in height.

In embodiments, one or more of the doped Si layers 601b and one or more of the doped SiGe layers 602 can include one or more dopants. In embodiments, the dopants may be one or more of boron, carbon, nitrogen, oxygen, or phosphorous. The dopant in the doped Si layers and doped SiGe layers can be the same dopant or a different dopant. In some embodiments, the dopant is the same in the one or more of the doped Si layers and the one or more of the doped SiGe layers. In some embodiments, the dopant is carbon. In embodiments, the dopant(s) in one or more of the doped Si layers 601b and/or in one or more of the doped SiGe layers 602 can be at a concentrations as described above In embodiments, the stack 600 may also include an isolation layer 615 which may be immediately adjacent to and below a doped SiGe layer 602. Further, the isolation layer 615 may be near a lowermost area of the stack 600 (e.g., atop a substrate 613).

In embodiments, the isolation layer 615 may include a vertically repeating sequence of layers which may include one doped SiGe layer 615a, and immediately adjacent thereto, one doped Si layer 615b.

In embodiments, a height of each doped Si layer 615b can be greater than a height of each doped SiGe layer 615a. In embodiments, one or more of the doped Si layers 615b may be about 5 to about 35 nm, or about 20 nm in height. In embodiments, one or more of the doped SiGe layers 615a may be about 3 nm to about 55 nm in height, or about 10 nm in height.

In embodiments, one or more of the doped Si layers 615b and one or more of the doped SiGe layers 615a can include one or more dopants. In embodiments, the dopants may be one or more of boron, carbon, nitrogen, oxygen, or phosphorous. In embodiments, the dopant(s) in one or more of the doped Si layers 615b and/or in one or more of the doped SiGe layers 615a can be at a concentrations as described above with respect to FIG. 4. The dopant(s) in the doped Si layers 615b and the doped SiGe layers 615a are different than the dopant(s), if any, in any of the other Si or SiGe layers in the stack 600.

In embodiments and as depicted in FIG. 6A, the stack 600 may undergo anisotropic etching to create a vertical slit or hole 610 to or near a bottom of the stack 600, including through the isolation layer 615. Thereafter, according to embodiments, the stack 600 may undergo anisotropic etching selective to the isolation layer 615 to create a vertical slit or hole (indicated by arrow 611) that can extend into but not beyond the isolation layer 615. The anisotropic etching to form the hole can be done in any suitable manner to form the hole through each of the alternating non-doped Si layers 601a, doped Si layers 601b, and doped SiGe layers 602, and can etch partially into but not through the isolation layer 615. Although the hole is depicted along the edge of the figures, one of ordinary skill would appreciate that the hole is typically formed through the layers with material on all sides and that the illustrative features and processes described herein are typically performed to fabricate a plurality of such features (holes, recesses, etc.) simultaneously on a substrate, such as a semiconductor wafer or the like.

In embodiments and as depicted in FIG. 6B, the stack 600 may undergo lateral isotropic etching of one or more of the doped SiGe layers 602 and/or one or more of the doped SiGe layers 615a (as indicated by arrows 605) to form a recess 606 in each of the etched layers in regions adjacent to the hole (e.g., arrow 611). The lateral isotropic etching of the doped SiGe layers 602 and/or the doped SiGe layers 615a is selective to the doped SiGe layers 602 and doped SiGe layers 615a as compared to the Si layers 601a,b and the Si layers 615b, so that the recesses 606 can be formed with little or no etching of the Si layers 601a,b or Si layer 615a.

As depicted in FIG. 6C, the stack 600 may subsequently undergo isotropic etching of one or more of the non-doped Si layers 601a, one or more of the doped Si layers 601b, and one or more of the doped Si layers 615b (as indicated by arrows 608). The isotropic etching can remove portions of the doped Si layers 601b and doped Si layers 615b that are adjacent to recesses 606. The isotropic etching further thins the non-doped Si layers 601a to form thinned portions 604 of the non-doped Si layers 601a adjacent to the recess 606. Such thinned portions 604 of the non-doped Si layers 601a can correspond to Si channel regions in a fully fabricated 3D DRAM device. In embodiments, the one or more thinned portions 604 may be about 10 to about 40 nm in height.

Accordingly, one or more cavities, or openings 603, can be formed (e.g., as defined by the doped SiGe layers 602, the doped Si layer 601b between the doped SiGe layers 502, and adjacent thinned portions 604 of the non-doped Si layers 601a on either side of the doped SiGe layers 602). Thus, the openings 603 have a height equal to about the height of the doped Si layer 601b, plus the height of the doped SiGe layers 602 on opposing sides of the doped Si layer 601b, and plus the heights of the etched portions of the non-doped Si layers 601a on either side of the opening 603. In embodiments, one or more of the openings 503 may be about 30 to about 90 nm in height.

As also shown in FIG. 6C, while doped Si layer 615b adjacent to the recess on both sides of the doped Si layer 615b can be completely removed, a bottommost layer of the one or more doped Si layers 615b can be thinned while leaving a portion of the layer disposed atop the substrate 613. Such a structure advantageously facilitates subsequent formation of a bitline 612 (shown in dashed lines in FIG. 6C) that does not contact the substrate 613, thus preventing shorting of the bitline 612 to the substrate 613 while still connecting to the openings 603. Although shown only in connection with FIGS. 6A-6C, the bottom isolation layer 615 can be provided in any of the embodiments described herein.

Figure 7:
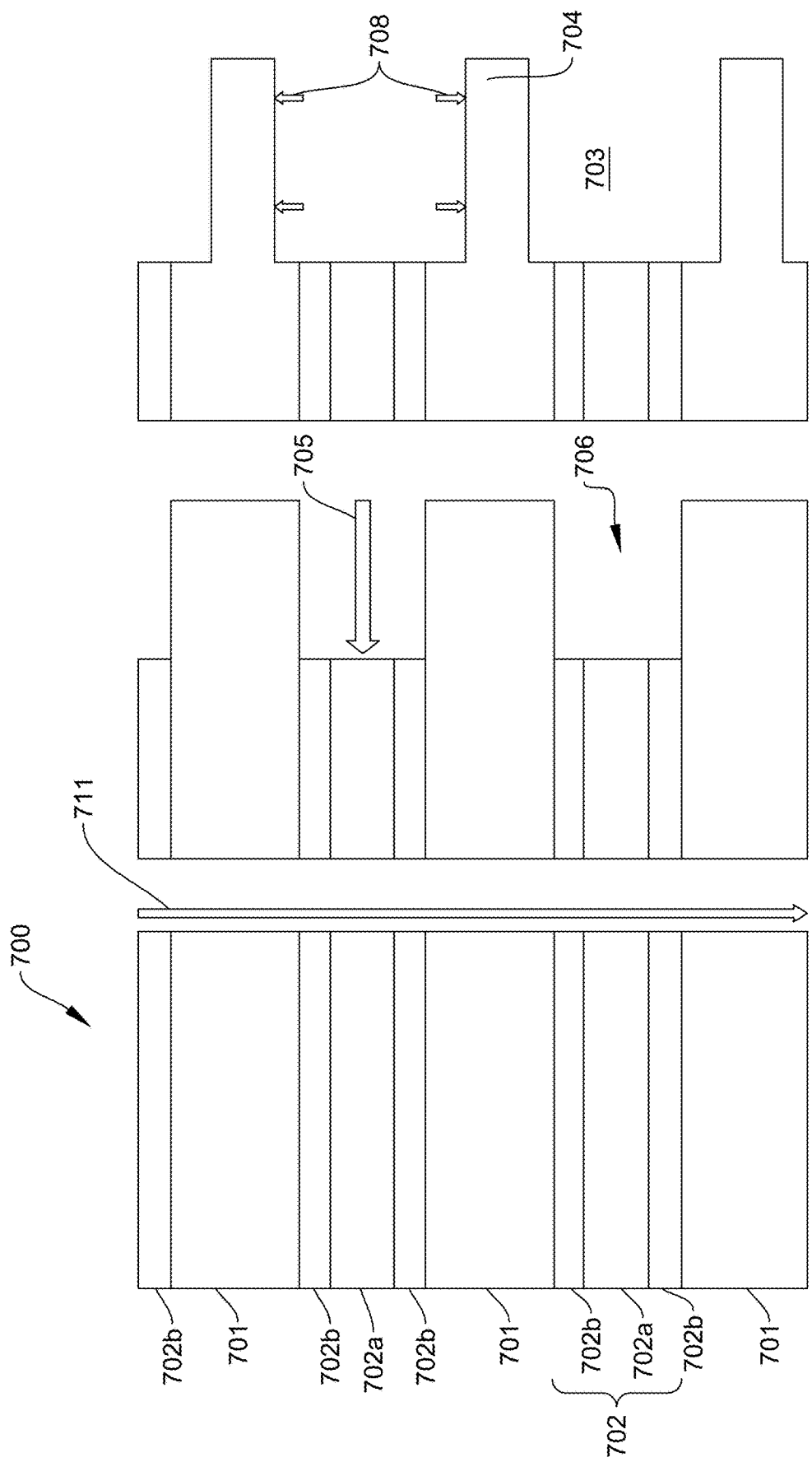
FIGS. 7A-7C depict a schematic side view of stages of fabrication of a three-dimensional dynamic random-access memory (3D DRAM) structure in accordance with at least some embodiments of the present disclosure.
Figure 8:
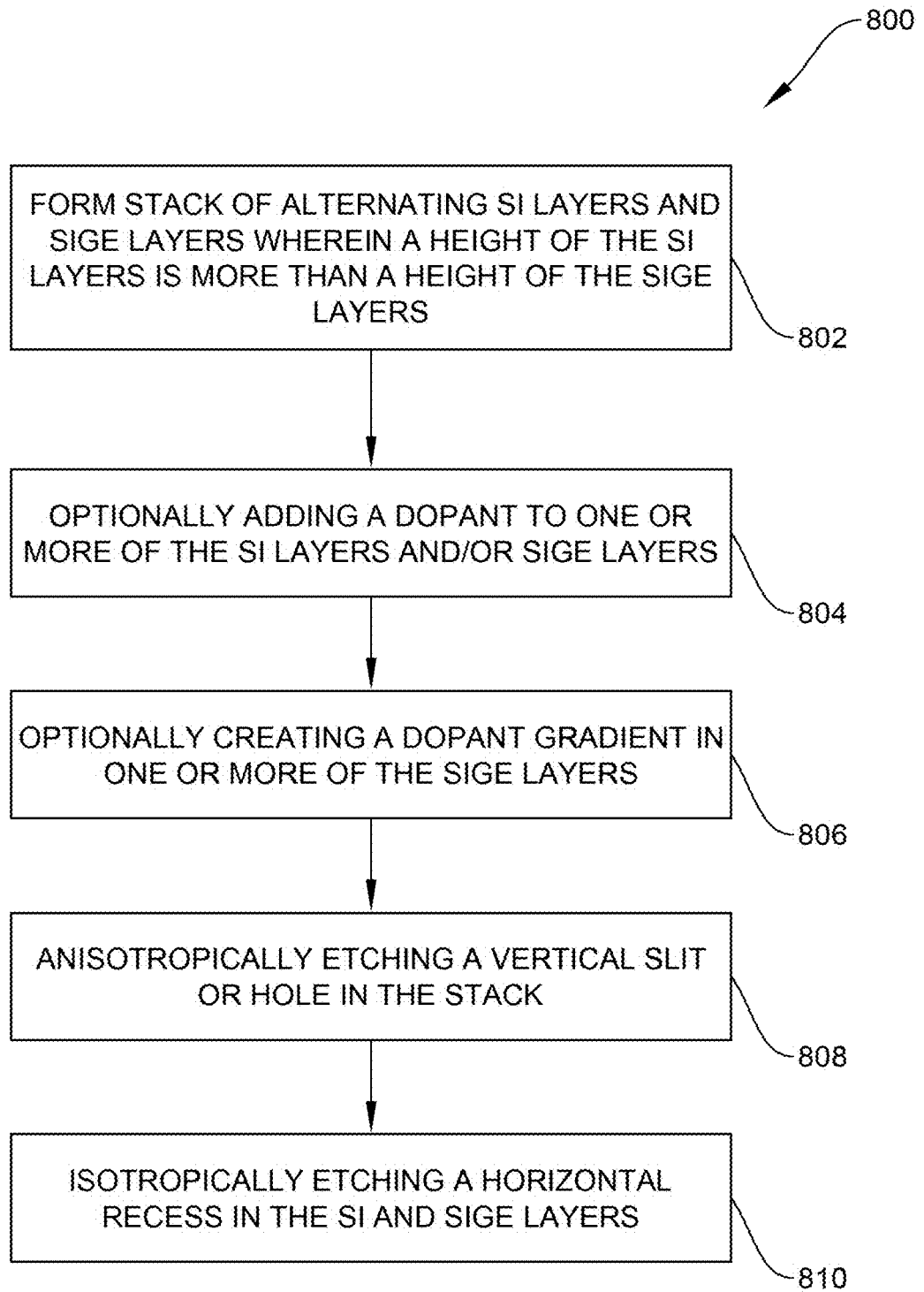
FIG. 8 is a flow chart depicting a method of forming a three-dimensional dynamic random-access memory (3D DRAM) structure in accordance with at least some embodiments of the present disclosure.

FIGS. 7A-7C depict schematic side views of a 3D DRAM stack 700 in accordance with at least some embodiments of the present disclosure. Similar layers and features can be as described above with respect to FIGS. 2A-2C, 3A-3C, 4A-4C, 5A-5C, and 6A-6C. The stack 700 can include alternating non-doped Si layers 701 and doped SiGe layers 702. In embodiments, one or more of the doped SiGe layers 702 can include a dopant gradient that can have a doped central region 702*a* and doped outer regions 702*b* on either side of the central region 702*a* (e.g., a doped outer SiGe layers and a central doped SiGe layer). In one or more of the doped SiGe layers 702, Ge may be present at about 5 atomic percent to about 40 atomic percent, or about 10 atomic percent.

In embodiments, the stack 700 may include a repeating sequence of layers which may include one non-doped Si layer 701, and immediately adjacent thereto, one doped SiGe outer region 702*b*, and immediately adjacent thereto, one doped SiGe central region 702*a*, and immediately adjacent thereto, one other doped SiGe outer region 702*b*.

In embodiments, a height of each Si layer 701 can be about equal to a height of each SiGe layer 702, can also be greater than a height of each SiGe central region 702*a*, and can also be greater than a height of each SiGe outer region 702*b*. In embodiments, one or more of the non-doped Si layers 701 may be about 25 to about 50 nm in height. In embodiments, one or more of the doped SiGe layers 702 may be about 3 to about 30 nm in height. In embodiments, one or more of the doped SiGe central regions 702*a* may be about 1 to about 10 nm in height. In embodiments, one or more of the doped SiGe outer regions may be about 1 to about 10 nm in height.

In embodiments, one or more of the doped SiGe layers 702 can include one or more dopants. In embodiments, the dopants may be one or more of boron, carbon, nitrogen, oxygen, or phosphorous. In some embodiments, the dopant is carbon. The dopant(s) in one or more of the doped SiGe central regions 702*a* can be at a concentration higher than that in one or more of the doped SiGe outer regions 702*b*. In embodiments, a dopant(s) in the central region 702*a* can be at concentrations as described above with respect to FIG. 4.

In embodiments and as depicted in FIG. 7A, the stack 700 may undergo anisotropic etching to create a vertical slit or hole (indicated by arrow 711) through the alternating non-doped Si layers 701 and doped SiGe layers 702. The anisotropic etching can be done in any suitable manner to form the hole through each of the alternating non-doped Si layers 701 and doped SiGe layers 702. Although the hole is depicted along the edge of the figures, one of ordinary skill would appreciate that the hole is typically formed through the layers with material on all sides and that the illustrative features and processes described herein are typically performed to fabricate a plurality of such features (holes, recesses, etc.) simultaneously on a substrate, such as a semiconductor wafer or the like.

Thereafter, according to embodiments and as depicted in FIG. 7B, the stack 700 may undergo lateral isotropic etching of one or more of the doped SiGe layers 702 (as indicated by arrows 705) to form recesses 706 in the doped SiGe layers 702 in regions adjacent to the hole (e.g., arrow 711). The lateral isotropic etching of the doped SiGe layers 702 is selective to the doped SiGe layers 702 as compared to the Si layers 701 so that recess 706 can be formed with little or no etching of the Si layers 701.

Next, according to embodiments and as depicted in FIG. 7C, the stack 700 may undergo isotropic etching of one or more of the non-doped Si layers 701 (as indicated by arrows 708). For example, the Si layers 701 can be isotropically etched to thin the Si layers 701 to form thinned portions 704 of the Si layers 701 adjacent to the recesses 706. Such thinned portions 704 of the Si layers 701 can correspond to Si channel regions in a fully fabricated 3D DRAM device. In embodiments, the one or more thinned portions 704 may be about 5 to about 35 nm in height.

Accordingly, one or more cavities, or openings 703, can be formed (e.g., as defined by the doped SiGe layers 702 adjacent thinned portions 704 of the Si layers 701 on either side of the doped SiGe layers 702). Thus, the openings 703 have a height equal to about the height of the doped SiGe layer 702 and the heights of the etched portions of the Si layers 701 on either side of the doped SiGe layer 702. In embodiments, one or more of the openings 703 may be about 30 to about 90 nm in height.

At 804, the method 800 can optionally include adding a dopant to one or more of the Si layers (see, e.g., FIGS. 4A, 5A, 6A, and 7A). At 804, the method 800 can also optionally include adding a dopant to one or more of the SiGe layers (see, e.g., FIGS. 4A, 5A, 6A, and 7A). The dopant can be added in any suitable manner, such as by providing a desired amount of a gas containing the dopant element during the deposition of the layer to be doped.

In embodiments, at 806, the method 800 may optionally include creating a dopant gradient in the one or more SiGe layers. The gradient may be stepped or continuous. For example, as depicted in FIGS. 7A-7C, the doped SiGe layer includes doped SiGe central regions 702*a* and doped SiGe outer regions 702*b*, wherein the doped SiGe central regions 702*a* can have a dopant concentration that is higher than the dopant concentration in the doped SiGe outer regions 702*b*. In some embodiments, the doped SiGe central regions 702*a* can be stepped up to the higher concentration. Alternatively, in some embodiments, the dopant concentration in the doped SiGe layer 702 can be gradually increased from the doped SiGe outer region 702*b* beneath the doped SiGe central region 702*a* to obtain the higher concentration.

At 808, the method 800 can include anisotropically etching a vertical slit or hole in the stack. The anisotropic etching can be performed in a suitable etching chamber, such as a plasma etching chamber.

In embodiments, at 810, the method 800 may include isotropically etching a horizontal recess in at least one of the SiGe layers. The isotropic etching at 808 can be performed in a suitable etching chamber, such as a plasma etching chamber. In some embodiments, the anisotropic etching at 806 and the isotropic etching at 808 can be performed in the same chamber. In some embodiments, the anisotropic etching at 806 and the isotropic etching at 808 can be performed in different chambers.

At 810, the method 800 may also include isotropically etching a horizontal recess in at least one of the Si layers and/or at least one of the SiGe layers. The isotropic etching at 810 can be performed in a suitable etching chamber, such as a plasma etching chamber. The isotropic etching at 810 can be performed in the same chamber or in different chambers. In some embodiments, the anisotropic etching at 808 and the isotropic etching at 810 can be performed in the same chamber. In some embodiments, the anisotropic etching at 808 and the isotropic etching at 810 can be performed in different chambers. The isotropic etching of the horizontal recess in at least one of the Si layers and/or at least one of the SiGe layers can be done in a sequence of several processes, such as to first form the recesses 206, 306, 406, 506, 606, and 706, and then to subsequently form the openings 203, 303, 403, 503, 603, and 703 as described above.

In embodiments, at 808, the method 800 may include isotropically etching a horizontal recess in at least one of the SiGe layers. The isotropic etching at 808 can be performed in a suitable etching chamber, such as a plasma etching chamber. In some embodiments, the anisotropic etching at 806 and the isotropic etching at 808 can be performed in the same chamber. In some embodiments, the anisotropic etching at 806 and the isotropic etching at 808 can be performed in different chambers.

At 810, the method 800 may also include isotropically etching a horizontal recess in at least one of the Si layers and/or at least one of the SiGe layers. The isotropic etching at 810 can be performed in a suitable etching chamber, such as a plasma etching chamber. The isotropic etching at 808 and 810 can be performed in the same chamber or in different chambers. In some embodiments, the anisotropic etching at 806 and the isotropic etching at 808 and 810 can be performed in the same chamber. In some embodiments, the anisotropic etching at 806 and the isotropic etching at 808 and 810 can be performed in different chambers. The isotropic etching of the horizontal recess in at least one of the Si layers and/or at least one of the SiGe layers can be done in a sequence of several processes, such as to first form the recesses 206, 306, 406, 506, 606, and 706, and then to subsequently form the openings 203, 303, 403, 503, 603, and 703 as described above.

The method generally ends at 810. However, the resultant structures depicted in FIGS. 2C, 3C, 4C, 5C, 6C, and 7C may advantageously be further processed to continue fabrication of a 3D DRAM device with reduced stress-induced defects as compared to conventional 3D DRAM devices.

Though not depicted in the above-described Figures, a base or substrate Si layer may be provided below one or more of the stacks 200, 300, 400, 500, 600, 700. Further, a lithography stack may be provided at a top of one or more of the foregoing stacks at various stages of etching. Also, while the foregoing stacks are depicted in the Figures as having an illustrative number of repeating sequences of layers in a vertical/height direction, the illustrative number is shown for purposes of clarity of description and is not intended to limit the number of repeating sequences. Similarly, any one of the foregoing stacks, holes, recesses, etc. may be repeated in a horizontal/width direction.

The method 800 described above may be performed in a tool 900 (e.g., an integrated tool or a cluster tool) including suitable process chambers configured for one or more of chemical vapor deposition (CVD) and plasma etching. Exemplary processing systems that may be used to perform the inventive methods disclosed herein may include, but are not limited to, those of the ENDURA®, CENTURA®, or PRODUCER® line of processing systems commercially available from Applied Materials, Inc., of Santa Clara, California. Other process chambers, including those from other manufacturers, may also be suitably used in connection with the teachings provided herein.

For example, an integrated tool (e.g., tool 900) described below facilitates operation of the methods described herein such that there are limited or no vacuum breaks between processes. Reduced vacuum breaks may limit or prevent contamination (e.g., oxidation) of the tungsten liner layer or other portions of the substrate and may further enhance throughput by reducing the amount of time between processes and reducing or eliminating certain processes such as pre-clean operations or other operations that would otherwise be required where the process to be performed sequentially in standalone process chambers.

The tool 900 includes a vacuum-tight processing platform (processing platform 901), a factory interface 904, and a system controller 902. The processing platform 901 comprises multiple process chambers, such as for example 914A, 914B, 914C, and 914D operatively coupled to a vacuum substrate transfer chamber (transfer chamber 903). The factory interface 904 is operatively coupled to the transfer chamber 903 by one or more load lock chambers (two load lock chambers, such as 906A and 906B shown in FIG. 9).

Figure 9:
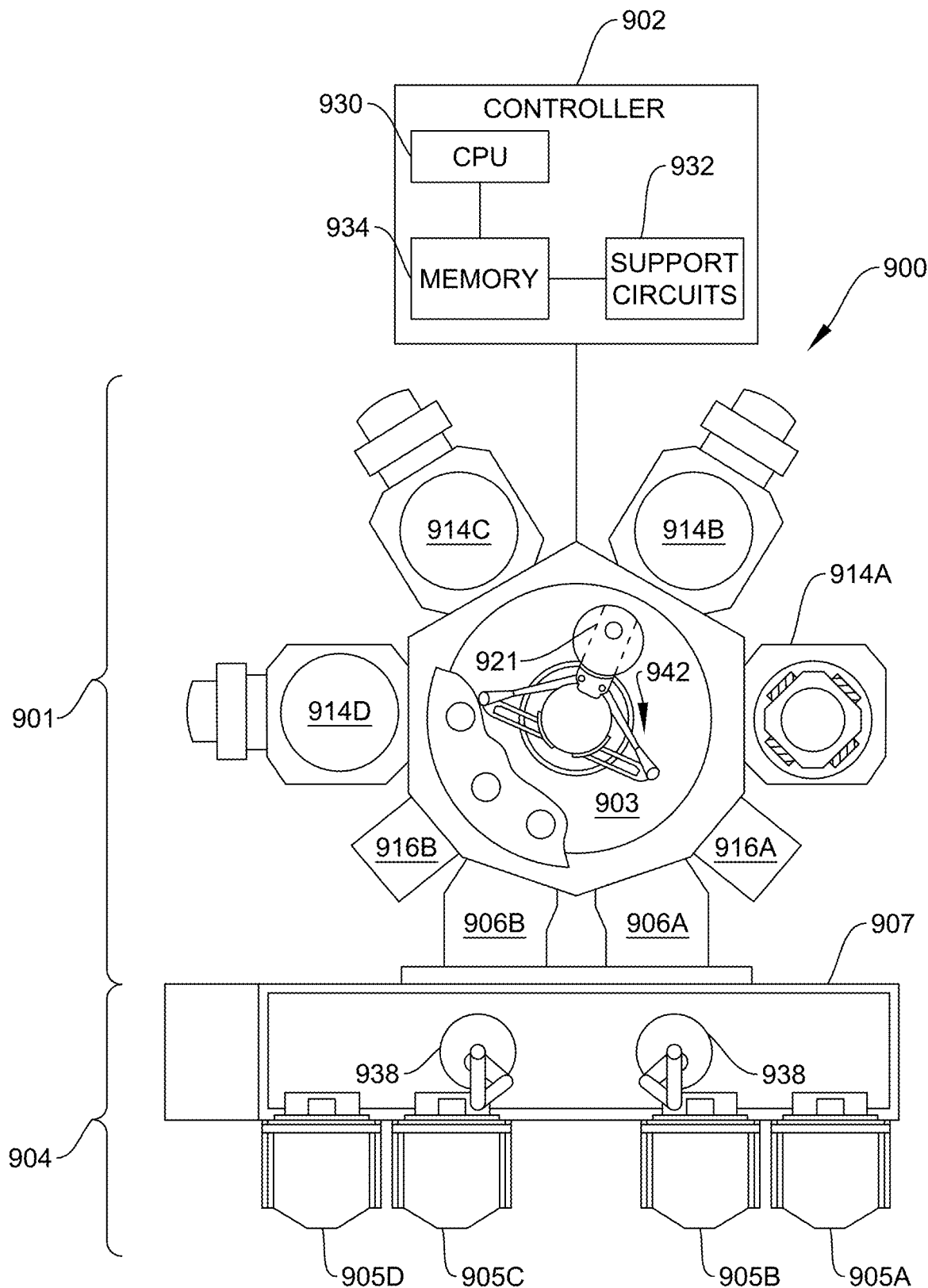
FIG. 9 is a schematic diagram of an apparatus for processing a substrate in accordance with at least some embodiments of the present disclosure.

In some embodiments, the factory interface 904 comprises at least one docking station 907, at least one factory interface robot 938 to facilitate the transfer of one or more semiconductor substrates (e.g., wafers). The docking station 907 is configured to accept one or more front opening unified pod (FOUP). Four FOUPS, such as 905A, 905B, 905C, and 905D are shown in the embodiment of FIG. 9. The factory interface robot 938 is configured to transfer the substrates from the factory interface 904 to the processing platform 901 through the load lock chambers, such as 906A and 906B. Each of the load lock chambers 906A and 906B have a first port coupled to the factory interface 904 and a second port coupled to the transfer chamber 903. The load lock chamber 906A and 906B are coupled to a pressure control system (not shown) which pumps down and vents the load lock chambers 906A and 906B to facilitate passing the substrates between the vacuum environment of the transfer chamber 903 and the substantially ambient (e.g., atmospheric) environment of the factory interface 904. The transfer chamber 903 has a vacuum robot 942 disposed within the transfer chamber 903. The vacuum robot 942 is capable of transferring substrates 921 between the load lock chamber 906A and 906B and the process chambers 914A, 914B, 914C, and 914D.

In some embodiments, the process chambers 914A, 914B, 914C, and 914D, are coupled to the transfer chamber 903. The process chambers 914A, 914B, 914C, and 914D comprise at least a CVD chamber and a plasma etch chamber. Additional CVD chambers and/or etch chambers may also be provided.

In some embodiments, at least one deposition chamber is provided that is configured to deposit a stack of alternating silicon (Si) layers and silicon germanium (SiGe) layers, wherein a height of each Si layer is greater than a height of each SiGe layer, such as described above in any of FIG. 2A, 3A, 4A, 5A, 6A, or 7A. In some embodiments, the at least one deposition chamber is further configured to provide one or more dopants in one or more of the Si layers and SiGe layers, such as described above in any of FIG. 4A, 5A, 6A, or 7A.

In some embodiments a first plasma etch chamber is provided that is configured to anisotropically etch a vertical hole (e.g., holes indicated by arrows 211, 311, 411, 511, 611, or 711) through the stack of alternating silicon (Si) layers and silicon germanium (SiGe) layers.

In some embodiments, a second plasma etch chamber is provided that is configured to isotropically etch a recess (e.g., recess 206, 306, 406, 506, 606, or 706) as described above in any of FIG. 2B, 3B, 4B, 5B, 6B, or 7B. In some embodiments, the first plasma etch chamber is the same as the second plasma etch chamber. In some embodiments, the first plasma etch chamber is different than the second plasma etch chamber.

In some embodiments, a third plasma etch chamber is provided that is configured to isotropically etch an opening (e.g., opening 203, 303, 403, 503, 603, or 703) as described above in any of FIG. 2C, 3C, 4C, 5C, 6C, or 7C. In some embodiments, the third plasma etch chamber is the same as the second plasma etch chamber. In some embodiments, the third plasma etch chamber is the same as the first plasma etch chamber and the second plasma etch chamber. In some embodiments, the third plasma etch chamber is different than the first plasma etch chamber and the second plasma etch chamber.

In some embodiments, one or more optional service chambers (shown as 916A and 916B) may be coupled to the transfer chamber 903. The service chambers 916A and 916B may be configured to perform other substrate processes, such as degassing, bonding, chemical mechanical polishing (CMP), wafer cleaving, etching, plasma dicing, orientation, substrate metrology, cool down and the like.

The system controller 902 controls the operation of the tool 900 using a direct control of the process chambers 914A, 914B, 914C, and 914D or alternatively, by controlling the computers (or controllers) associated with the process chambers 914A, 914B, 914C, and 914D and the tool 900. In operation, the system controller 902 enables data collection and feedback from the respective chambers and systems to optimize performance of the tool 900. The system controller 902 generally includes a central processing unit (CPU) 930, a memory 934, and a support circuit 932. The CPU 930 may be any form of a general-purpose computer processor that can be used in an industrial setting. The support circuit 932 is conventionally coupled to the CPU 930 and may comprise a cache, clock circuits, input/output subsystems, power supplies, and the like. Software routines, such as processing methods as described above may be stored in the memory 934 (e.g., non-transitory computer readable storage medium) and, when executed by the CPU 930, transform the CPU 930 into a specific purpose computer (system controller 902). The software routines may also be stored and/or executed by a second controller (not shown) that is located remotely from the tool 900.

While the foregoing is directed to embodiments of the present disclosure, other and further embodiments of the disclosure may be devised without departing from the basic scope thereof.

The invention claimed is:

1. A method of forming a three-dimensional dynamic random-access memory (3D DRAM) structure, comprising:
    forming a stack of alternating silicon (Si) layers and silicon germanium (SiGe) layers, wherein a height of the Si layers is more than a height of the SiGe layers, wherein the stack includes a first Si layer, a first SiGe layer, a second Si layer, and a second Sige layer, wherein the second Si layer has a height less than the height of the first Si layer;
    anisotropically etching a vertical slit or hole in the stack;
    isotropically etching at least one of the SiGe layers to form a first horizontal recess, wherein the SiGe layer substantially completely removed between a portion of the Si layers; and
    isotropically etching a second horizontal recess in the portion of the Si layers adjacent to the at least one etched SiGe layer to form a thinned portion of the Si layer, wherein the first horizontal recess and the second horizontal recess together form a cavity between adjacent Si layers.

2. The method of claim 1, further comprising:
    wherein isotropically etching at least one of the SiGe layers to form a first horizontal recess further comprises isotropically etching at least one pair of adjacent SiGe layers to form a pair of first horizontal recesses, wherein the pair of adjacent SiGe layers enclose a thinner Si layer of the Si layers; and
    wherein the second horizontal recess is etched in outer Si layers disposed adjacent to and on either side of the at least one pair of adjacent SiGe layers and wherein a portion of the thinner Si layer is completely removed such that the cavity is defined between the outer Si layers.

3. A method of forming a three-dimensional dynamic random-access memory (3D DRAM) structure, comprising:
    forming a stack of alternating silicon (Si) layers and silicon germanium (SiGe) layers, wherein a height of the Si layers is more than a height of the SiGe layers, wherein forming the stack further comprises forming at least one SiGe layer as a doped SiGe layer including at least one dopant comprising at least one of boron, carbon, nitrogen, oxygen, or phosphorous;
    anisotropically etching a vertical slit or hole in the stack;
    isotropically etching at least one of the SiGe layers to form a first horizontal recess, wherein the SiGe layer substantially completely removed between a portion of the Si layers; and
    isotropically etching a second horizontal recess in the portion of the Si layers adjacent to the at least one etched SiGe layer to form a thinned portion of the Si layer, wherein the first horizontal recess and the second horizontal recess together form a cavity between adjacent Si layers.

4. The method of claim 3, wherein forming the stack further comprises forming a doped Si layer disposed on either side of the doped SiGe layer, wherein the doped Si layer has a height that is less than a height of the doped SiGe layer.

5. The method of claim 3, wherein forming the stack further comprises forming the SiGe layers as doped SiGe layers including at least one dopant comprising at least one of boron, carbon, nitrogen, oxygen, or phosphorous, wherein alternating Si layers are undoped Si layers and doped Si layers, and wherein a height of each undoped Si layer is greater than a height of each doped Si layer.

6. The method of claim 1, wherein forming the stack further comprises forming a doped isolation layer disposed at a bottom of the stack of the alternating layers.

7. The method of claim 3, wherein forming the stack further comprises:
    forming at least one pair of SiGe layers with at least one dopant comprising at least one of boron, carbon, nitrogen, oxygen, or phosphorous; and
    forming a central SiGe layer disposed between each pair of SiGe layers of the at least one pair of SiGe layers, the central SiGe layer being doped with a dopant concentration higher than the dopant concentration in the at least one pair of SiGe layers.

8. A non-transitory computer readable medium, having instructions formed thereon that, when executed, cause a process chamber to perform a method, the method as described in claim 1.

9. The computer readable medium of claim 8, wherein the method further comprises:

wherein isotropically etching at least one of the SiGe layers to form a first horizontal recess further comprises isotropically etching at least one pair of adjacent SiGe layers to form a pair of first horizontal recess, wherein the pair of adjacent SiGe layers enclose a thinner Si layer; and wherein the second horizontal recess is etched in outer Si layers disposed adjacent to and on either side of the at least one pair of adjacent SiGe layers and wherein a portion of the thinner Si layer is completely removed such that the cavity is defined between the outer Si layers.

10. The computer readable medium of claim 8, wherein forming the stack further comprises forming a doped isolation layer disposed at a bottom of the stack of the alternating layers.

11. The method of claim 3, wherein forming the stack further comprises forming a doped isolation layer disposed at a bottom of the stack of the alternating layers.

12. A non-transitory computer readable medium, having instructions formed thereon that, when executed, cause a process chamber to perform a method, the method as described in claim 3.

13. The computer readable medium of claim 12, wherein forming the stack further comprises forming a doped Si layer disposed on either side of the doped SiGe layer, wherein the doped Si layer has a height that is less than a height of the doped SiGe layer.

14. The computer readable medium of claim 12, wherein forming the stack further comprises forming the SiGe layers as doped SiGe layers including at least one dopant comprising at least one of boron, carbon, nitrogen, oxygen, or phosphorous, wherein alternating Si layers are undoped Si layers and doped Si layers, and wherein a height of each undoped Si layer is greater than a height of each doped Si layer.

15. The computer readable medium of claim 12, wherein forming the stack further comprises forming a doped isolation layer disposed at a bottom of the stack of the alternating layers.

16. The computer readable medium of claim 12, wherein forming the stack further comprises:
    forming at least one pair of SiGe layers with at least one dopant comprising at least one of boron, carbon, nitrogen, oxygen, or phosphorous; and
    forming a central SiGe layer disposed between each pair of SiGe layers of the at least one pair of SiGe layers, the central SiGe layer being doped with a dopant concentration higher than the dopant concentration in the at least one pair of SiGe layers.

17. The computer readable medium of claim 12, wherein forming the stack further comprises forming a doped isolation layer disposed at a bottom of the stack of the alternating layers.

\* \* \* \* \*